(12) United States Patent
Yao

(10) Patent No.: US 8,536,584 B2
(45) Date of Patent: Sep. 17, 2013

(54) HIGH VOLTAGE WIRE BOND FREE LEDS

(75) Inventor: Zhimin Jamie Yao, Goleta, CA (US)

(73) Assignee: Cree, Inc., Durham, NC (US)

( * ) Notice: Subject to any disclaimer, the term of this patent is extended or adjusted under 35 U.S.C. 154(b) by 304 days.

(21) Appl. No.: 12/905,995

(22) Filed: Oct. 15, 2010

(65) Prior Publication Data

US 2011/0084294 A1    Apr. 14, 2011

Related U.S. Application Data

(63) Continuation-in-part of application No. 12/418,816, filed on Apr. 6, 2009, now Pat. No. 7,985,970, and a continuation-in-part of application No. 11/985,410, filed on Nov. 14, 2007.

(51) Int. Cl.
   *H01L 23/02* (2006.01)
(52) U.S. Cl.
   USPC .......... 257/79; 257/89; 257/104; 257/E33.064
(58) Field of Classification Search
   USPC .................... 257/79–104, E33.064
   See application file for complete search history.

(56) References Cited

U.S. PATENT DOCUMENTS

| | | | |
|---|---|---|---|
| 4,946,547 A | 8/1990 | Palmour et al. | 156/643 |
| 5,200,022 A | 4/1993 | Kong et al. | 156/612 |
| RE34,861 E | 2/1995 | Davis et al. | 437/100 |
| 5,959,316 A | 9/1999 | Lowery | 257/98 |
| 6,375,340 B1 | 4/2002 | Biebl | |
| 6,395,572 B1 | 5/2002 | Tsutsui | |
| 6,480,389 B1 | 11/2002 | Shie | |

(Continued)

FOREIGN PATENT DOCUMENTS

| | | |
|---|---|---|
| CN | 1871713 | 11/2006 |
| CN | 101027795 | 8/2007 |

(Continued)

OTHER PUBLICATIONS

International Search Report and Written Opinion for PCT/US2010/024980 mailed Oct. 6, 2010.

(Continued)

*Primary Examiner* — Michael Lebentritt

(74) *Attorney, Agent, or Firm* — Koppel, Patrick, Heybl & Philpott

(57) ABSTRACT

An LED chip and method of fabricating the same is disclosed that comprises a plurality of sub-LEDs, said sub-LEDs interconnected such that the voltage necessary to drive said sub-LEDs is dependent on the number of said interconnected sub-LEDs and the junction voltage of said sub-LEDs. Each of said interconnected sub-LEDs comprising an n-type semiconductor layer, a p-type semiconductor layer, and an active or quantum well region interposed between the n-type and p-type layers. The monolithic LED chip further comprising a p-electrode having a lead that is accessible from a point on a surface opposite of a primary emission surface of the monolithic LED chip, the p-electrode electrically connected to the p-type layer, and an n-electrode having a lead that is accessible from a point on the surface opposite of the primary emission surface, the n-electrode electrically connected to the n-type layer. These sub-LEDs interconnected by at least a metallization layer on the n-type and p-type layers, which is insulated so that it does not short the sub-LEDs. Further, the LED chip is capable of being electrically coupled for operation without wire bonds.

49 Claims, 4 Drawing Sheets

(56) References Cited

U.S. PATENT DOCUMENTS

| | | | |
|---|---|---|---|
| 6,486,499 B1 | 11/2002 | Krames et al. | 257/81 |
| 6,489,637 B1 | 12/2002 | Sakamoto | |
| 6,547,249 B2 | 4/2003 | Collins et al. | 257/88 |
| 6,642,652 B2 | 11/2003 | Collins et al. | 313/512 |
| 6,657,236 B1 | 12/2003 | Thibeault et al. | 257/98 |
| 6,791,259 B1 | 9/2004 | Stokes | |
| 6,828,596 B2 | 12/2004 | Steigerwald et al. | 257/99 |
| 6,869,812 B1 | 3/2005 | Liu | |
| 6,946,309 B2 | 9/2005 | Camras et al. | 438/26 |
| 6,972,438 B2 | 12/2005 | Li et al. | 257/98 |
| 7,154,125 B2 | 12/2006 | Koide et al. | 257/95 |
| 7,335,920 B2 | 2/2008 | Denbaars et al. | 257/79 |
| 7,348,212 B2 | 3/2008 | Schiaffino et al. | 438/106 |
| 7,518,158 B2 | 4/2009 | Keller et al. | 257/98 |
| 7,622,742 B2 | 11/2009 | Kim et al. | 257/79 |
| 7,683,377 B2 | 3/2010 | Nagai | 257/79 |
| 7,709,282 B2 | 5/2010 | Fukshima et al. | 438/26 |
| 7,714,342 B2 | 5/2010 | Lee et al. | 257/98 |
| 7,755,095 B2 * | 7/2010 | Nagai | 257/88 |
| 7,781,791 B2 | 8/2010 | Sakai et al. | 257/98 |
| 7,821,023 B2 | 10/2010 | Yuan et al. | 257/98 |
| 8,106,417 B2 * | 1/2012 | Yoo | 257/99 |
| 2002/0139987 A1 | 10/2002 | Collins et al. | |
| 2002/0180351 A1 | 12/2002 | McNulty | |
| 2004/0016936 A1 | 1/2004 | Tanaka et al. | |
| 2004/0041222 A1 | 3/2004 | Loh | |
| 2004/0217364 A1 | 11/2004 | Tarsa et al. | |
| 2005/0082562 A1 | 4/2005 | Ou et al. | |
| 2005/0139252 A1 | 6/2005 | Shim et al. | |
| 2005/0211989 A1 | 9/2005 | Horio et al. | |
| 2005/0224821 A1 | 10/2005 | Sakano | |
| 2006/0060874 A1 | 3/2006 | Edmond | |
| 2006/0063289 A1 | 3/2006 | Negley | |
| 2006/0081869 A1 | 4/2006 | Lu et al. | 257/99 |
| 2006/0273335 A1 | 12/2006 | Asahara | |
| 2007/0018182 A1 | 1/2007 | Beeson et al. | |
| 2007/0018184 A1 | 1/2007 | Beeson et al. | |
| 2007/0057271 A1 | 3/2007 | Schiaffino et al. | |
| 2007/0102693 A1 * | 5/2007 | Nagai | 257/13 |
| 2007/0109779 A1 | 5/2007 | Sekiguchi | |
| 2007/0145392 A1 | 6/2007 | Haberem | |
| 2007/0262338 A1 | 11/2007 | Higashi et al. | 257/99 |
| 2008/0179602 A1 | 7/2008 | Negley et al. | |
| 2008/0211416 A1 | 9/2008 | Negley et al. | |
| 2008/0217635 A1 | 9/2008 | Emerson | |
| 2009/0008654 A1 | 1/2009 | Nagai | |
| 2009/0050907 A1 | 2/2009 | Yuan et al. | 257/88 |
| 2009/0050908 A1 | 2/2009 | Yuan et al. | 257/88 |
| 2009/0072251 A1 | 3/2009 | Chan et al. | |
| 2009/0096386 A1 | 4/2009 | Yeh et al. | |
| 2009/0109151 A1 | 4/2009 | Kim et al. | 345/83 |
| 2009/0121241 A1 | 5/2009 | Keller et al. | |
| 2009/0129085 A1 * | 5/2009 | Aizar et al. | 362/247 |
| 2009/0261356 A1 | 10/2009 | Lee et al. | 257/88 |
| 2009/0267085 A1 | 10/2009 | Lee et al. | 257/88 |
| 2009/0283781 A1 | 11/2009 | Chan et al. | |
| 2009/0283787 A1 | 11/2009 | Donofrio et al. | |
| 2010/0059733 A1 | 3/2010 | Shei et al. | 438/52 |
| 2010/0155746 A1 | 6/2010 | Ibbetson et al. | 257/88 |
| 2010/0252840 A1 | 10/2010 | Ibbetson et al. | 257/88 |

FOREIGN PATENT DOCUMENTS

| | | |
|---|---|---|
| KR | 2002-77135 | 10/2002 |
| WO | WO 83/00408 A1 | 2/1983 |
| WO | WO 2007/141763 A1 | 12/2007 |
| WO | WO 2009/039805 A1 | 4/2009 |

OTHER PUBLICATIONS

Office Action for German Patent Application No. 10 2008 029 318.0 dated mailed Dec. 13, 2010.
Extended European Search Report for European Patent Application No. 10185708.4 mailed Dec. 2, 2010.
Office Action for Korean Patent Application No. 10-2005-7020463 mailed Dec. 21, 2010.
Cree EZ700 and EZ1000 EZBright LED chip data sheets.
Acriche LED data sheet, Seoul Semiconductor, 2007, pp. 1-2, available at www.acriche.com/en/product/prd/acriche.asp.
LAMINA TitanTurbo LED Light Engines data sheet, 2008, pp. 1-14.
U.S. Appl. No. 11/656,759, filed Jan. 2007.
U.S. Appl. No. 11/899,790, filed Sep. 2007.
U.S. Appl. No. 11/473,089, filed Jun. 2006.
U.S. Appl. No. 12/418,816, filed Apr. 2009.
U.S. Appl. No. 11/985,410, filed Nov. 2007.
Windisch et al. "Impact of Texture-Enhanced Transmission on High-Efficiency Surface-Textured Light-Emitting Diodes," Applied Physics Letters, vol. 79, No. 15, Oct. 2001, pp. 2315-2317.
Schnitzer et al. "30% External Quantum Efficiency From Surface Textured, Thin-Film Light-Emitting Diodes," Applied Physics Letters, Oct. 18, 1993, vol. 63, No. 16, pp. 2174-2176.
Windisch et al. "Light-Extraction Mechanisms in High-Efficiency Surface-Textured Light-Emitting Diodes", IEEE Journal on Selected Topics in Quantum Electronics, vol. 8, No. 2, Mar./Apr. 2002, pp. 248-255.
Streubel, et al. "High Brightness AlGaInP Light-Emitting Diodes", IEEE Journal on Selected Topics in Quantum Electronics, vol. 8, No. 2, Mar./Apr. 2002, pp. 321-332.
Nichia Corp. White LED, Part No. NSPW300BS.
Nichia Corp. White LED, Part No. NSPW312BS.
Written Opinion of the International Search Authority for PCT Application No. PCT/US2009/066743 filed Dec. 14, 2009.
International Search Report and Written Opinion for Patent Application No. PCT/US2011/001741, mailed Feb. 14, 2012.
Final Office Action from U.S. Appl. No. 12/321,059, mailed Sep. 24, 2010.
Response to Final Office Action, U.S. Appl. No. 12/321,059, filed Nov. 23, 2010.
Office Action from U.S. Appl. No. 12/321,059, mailed Feb. 11, 2011.
Response to Office Action, U.S. Appl. No. 12/321,059, filed Jun. 13, 2011.
Office Action from U.S. Appl. No. 12/329,713, mailed Aug. 3, 2011.
Response to Office Action U.S. Appl. No. 12/329,713, filed Dec. 5, 2011.
Final Office Action from U.S. Appl. No. 12/329,713, mailed Feb. 11, 2011.
Response to Final Office Action, U.S. Appl. No. 12/329,713, filed Jul. 8, 2011.
Office Action from U.S. Appl. No. 12/329,713, mailed Sep. 1, 2010.
Response to Office U.S. Appl. No. 12/329,713, filed Dec. 1, 2010.
Office Action U.S. Appl. No. 12/418,816, mailed Apr. 16, 2010.
Response to Office Action U.S. Appl. No. 12/418,816, filed Aug. 11, 2010.
Office Action from U.S. Appl. No. 12/418,816, mailed Oct. 29, 2010.
Response to Office Action U.S. Appl. No. 12/418,816, filed Feb. 28, 2011.
Office Action from U.S. Appl. No. 12/418,816, mailed Aug. 20, 2010.
Response to Office Action U.S. Appl. No. 12/418,816, filed Oct. 20, 2010.
Office Action from U.S. Appl. No. 12/329,713, mailed Feb. 15, 2012.
Response to Office Action U.S. Appl. No. 12/329,713, filed Aug. 15, 2012.
Office Action and Search Report for Chinese Patent Application No. 200980149197.2. dated Nov. 15, 2012.
Second Office Action from Chinese Patent Appl. No 200880124595.4, dated Jan. 6, 2013.

\* cited by examiner

HIGH VOLTAGE WIRE BOND FREE LEDS

RELATED APPLICATIONS

This is a continuation in part application from Ser. No. 12/418,816 filed Apr. 6, 2009 now U.S. Pat. No. 7,985,970, entitled "High Voltage Low Current Surface-Emitting LED", and application Ser. No. 11/985,410 filed Nov. 14, 2007, entitled "Wire Bond Free Wafer Level LED."

BACKGROUND OF THE INVENTION

1. Field of the Invention

This invention relates to light emitting diode (LED) chips and in particular LED chips having multiple series connected junctions interconnected to allow for high voltage and low current operation and capable of wire bond free fabrication and operation.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangements, it is known to enclose an LED chip in a package to provide environmental and/or mechanical protection, color selection, light focusing and the like. An LED package can also include electrical leads, contacts or traces for electrically connecting the LED package to an external circuit. FIG. 1 shows a conventional LED package that generally comprises a single LED chip 12 mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 can be filled with an encapsulant material 16 which can contain a wavelength conversion material such as a phosphor. Light emitted by the LED at a first wavelength can be absorbed by the phosphor, which can responsively emit light at a second wavelength. The entire assembly is then encapsulated in a clear protective resin 14, which may be molded in the shape of a lens over the LED chip 12.

FIG. 2 shows another conventional LED package 20 that may be more suited for high power operations that can generate more heat. In the LED package 20, one or more LED chips 22 are mounted onto a carrier such as a printed circuit board (PCB) carrier, substrate or submount 23. A reflector 24 can be included on the submount 23 that surrounds the LED chip(s) 22 and reflects light emitted by the LED chips 22 away from the package 20. Different reflectors can be used such as metal reflectors, omni-directional reflectors (ODRs), and distributed Bragg reflectors (DBRs). The reflector 24 can also provide mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Many LED components for solid state lighting applications attempt to achieve high light output by operating single LED chips at as high as possible current and at a low voltage typical for individual LEDs. FIGS. 3a and 3b show one commercially available LED 30 available from Cree® Inc. under the EZ700™ LED product designation. The LED comprises a single LED junction 32 as well as a current spreading structure 34 on its top to spread current from the top contact 36. Current spreading layers can also be included. The particular voltage level for these types of single junction LED chips can be dependent upon the particular material system used for the LEDs and the voltage necessary based on junction voltage. For example, some Group-III nitride based LEDs can have junction voltage in the 2.5 to 3.5 volt range and increased luminous flux for these LEDs can be achieved by applying elevated current levels. One disadvantage of this approach is that at the systems level high current operation necessitates relatively expensive drivers to provide the constant DC current source for such components. Further, there can be limits to the level of current that can be applied to these LED chips and if the single junction fails, the chip can be unusable.

Higher light output can be achieved at the assembly level by mounting several LED packages onto a single circuit board. FIG. 4 shows a sectional view of one such distributed integrated LED package array 50 comprising a plurality of LED packages 52 mounted to a substrate/submount 54 to achieve higher luminous flux. Typical arrays include many LED packages, with FIG. 4 only showing two for ease of understanding and illustration. Alternatively, higher flux components have been provided by utilizing arrays of cavities, with a single LED chip mounted in each of the cavities. (e.g. TitanTurbo™ LED Light Engines provided by Lamina, Inc.). This multiple LED component arrangement can also allow for operation under high voltage and low current by assembling the multiple LED packages of a suitable current rating in series at the circuit board level. Driving solid state lighting components at high voltage and low currents may provide for lower cost driver solutions and ultimately lower system costs. However, the lower driver cost for such solutions can be outweighed by the high cost of the multiple individual components.

These LED array solutions can be less compact than desired as they provide for extended non-light emitting "dead space" between adjacent LED packages and cavities. This dead space provides for larger devices, and can limit the ability to shape the output beam by a single compact optical element like a collimating lens or reflector into a particular angular distribution. This makes the construction of solid state lighting luminares that provide for directed or collimated light output within the form factor of existing lamps (or even smaller) difficult to provide. This can present challenges in providing a compact LED lamp structure incorporating an LED component that delivers light flux levels in the 1000 Lumen and higher range from a small optical source.

One high voltage low current solution includes monolithic LED chips or components having a plurality of LED junctions or sub-LEDs mounted onto a substrate/submount to create single compact optical source elements. Examples of high voltage low current LEDs can be found in copending U.S. application Ser. No. 12/418,816, also assigned to Cree, Inc. and incorporated herein. As shown in FIG. 5, presently these solutions use wire bonding to connect the sub-LEDs. The use of wire bonds, however, can be a disadvantageous because of their fragility. In addition, wire bonding can negatively impact light emission and detract from the physical appearance of LEDs when they are not emitting light. Wire bond free LEDs are in existence in the prior art, but only as single junction LEDs, not high voltage low current LEDs.

Wire Bond Free LEDs techniques are discussed in copending U.S. application Ser. No. 11/985,410, also assigned to Cree, Inc. and incorporated herein.

SUMMARY OF THE INVENTION

The present invention provides various embodiments of semiconductor devices and LED chips that are high voltage and wire bond free. The different embodiments comprise various arrangements having a number of sub-LEDs on a submount, the sub-LEDs formed from a single junction LED, and interconnections connecting these sub-LEDs.

One embodiment of an LED chip according to the present invention comprises a plurality of sub-LEDs, interconnected such that the voltage necessary to drive said sub-LEDs is dependent on the number of the interconnected sub-LEDs and the junction voltage of the sub-LEDs. Each of the interconnected sub-LEDs comprising an n-type semiconductor layer, a p-type semiconductor layer, and an active region interposed between the n-type and p-type layers. The monolithic LED chip further comprises a p-electrode having a lead that is accessible from a point on a surface opposite of a primary emission surface of the monolithic LED chip with the p-electrode electrically connected to the p-type layer. An n-electrode is including having a lead that is accessible from a point on the surface opposite of the primary emission surface, the n-electrode electrically connected to the n-type layer.

One method for fabricating another embodiment of a monolithic LED chip according to the present invention comprises providing a single junction LED on a submount, with the single junction LED including first and second semiconductor layers. The single junction LED is separated into a plurality of sub-LEDs, and the sub-LEDs are serially interconnected such that the voltage necessary to drive the sub-LEDs is dependent on the number of serially interconnected sub-LEDs and the junction voltage of the sub-LEDs. A portion of the surface of the first semiconductor layer opposite the growth substrate is exposed and a insulating layer is formed on the second semiconductor layer and the exposed portion of the first semiconductor layer. A portion of the insulating layer is removed such that a portion of the first and second semiconductor layers is exposed. An electrode layer is formed on the remaining portions of the insulating layer and the exposed portions of the first and second semiconductor layers. A portion of the electrode layer is removed to form first and second electrodes such that the first electrode is electrically contacting the first semiconductor layer and the second electrode is electrically contacting the second semiconductor layer, with the first and second electrodes disposed to be electrically isolated from one another and from the active region.

Another embodiment of a LED chip according to the present invention comprises a plurality of sub-LEDs on a submount, wherein the sub-LEDs are formed from a single junction LED. Electrically conductive and electrically insulating features interconnect the sub-LEDs such that an electrical current applied to the interconnected sub-LEDs is spread to the interconnected sub-LEDs by the electrically conductive features.

Still another embodiment of a LED chip according to the present invention comprises a plurality of sub-LEDs on a submount. A plurality of contacts or electrodes are included, each of which is located on a surface opposite of a primary light emission surface of the sub-LEDs. Metallization layers are placed on at least a portion of a light emission area of the sub-LEDs, opposite the primary light emission surface, interconnecting the sub-LEDs. Insulating features are included to insulate portions of the sub-LEDs from the metallization layers.

A better understanding of the features and advantages of the present embodiments will be obtained by reference to the following detailed description of the invention and accompanying drawings which set forth illustrative embodiments in which the principles of the invention are utilized.

BRIEF DESCRIPTION OF THE DRAWINGS

FIG. 3b is a side elevation view of the LED chip in FIG. 3a;

DETAILED DESCRIPTION OF THE INVENTION

Figure 1:
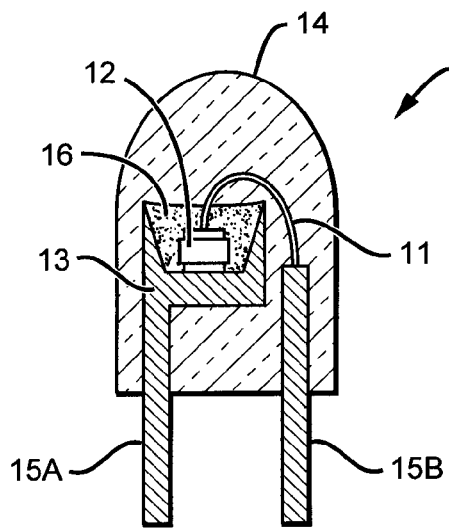
FIG. 1 shows a sectional view of a prior art LED package.
Figure 2:
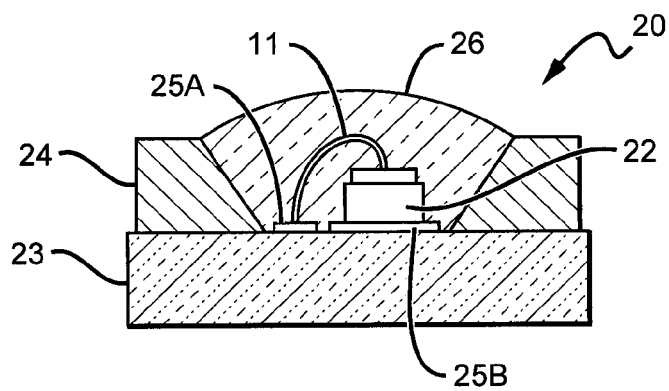
FIG. 2 shows a sectional view of another prior art LED package.

The present invention comprises a monolithic LED chip or component having a plurality of LED junctions or sub-LEDs mounted onto a substrate or submount ("submount") to create a single compact optical source element. As used in the present application, monolithic refers to LED chips wherein the emitters are mounted on one substrate or submount. According to the present invention, at least some of the junctions or sub-LEDs are arranged on the submount, with different embodiments providing multiple series interconnections, or combinations of series/parallel interconnections. The LED chips according to the present invention can emit different colors of light, with some embodiments emitting white light.

In one embodiment, an LED chip is provided having the same dimensions or footprint as a conventional high output single junction LED that uses low voltage and high current operation to provide high luminous flux operation. In some embodiments the active area of this type of conventional LED chip substantially covers its submount. According to the present invention, this area is divided into a plurality of junctions or sub-LEDs ("sub-LEDs") using different methods, such as a standard photolithography, deposition, etching, and ion implantation. Combinations of electrically conductive interconnects and insulating features can connect the sub-LEDs in series on the submount.

Since electrical power is provided at high AC voltage, operating conventional single junction LEDs and LED lighting systems from the grid requires some type of transformer and converter circuitry, which can be costly, bulky and lossy. The present invention provides for a novel LED chip architecture that is designed to operate at a high voltage and low current rather than the existing low voltage and high current configuration. An equivalent overall LED performance can be maintained, while at the same time maintaining the overall size of the LED chip and the requirements for contacting the LED chip. Equivalent performance is achieved by incorporating the functional elements of the existing single junction LED chip into each sub-LED and its junction. The high voltage and low current operation is achieved by connecting the individual sub-LEDs in series on the same submount used for a single junction LED chip. Preferably, the individual sub-LEDs are densely packed to maximize the active emission area for a given chip footprint. In one embodiment according to the present invention, the alignment tolerance between and critical dimension of each fabrication level is 2 um or less so that little active area is wasted between adjacent junctions or sub-LEDs.

The number of sub-LEDs can be tailored or customized to meet the available voltage level or the voltage level can be tailored to meet the number of junctions presented by the sub-LEDs. The number of sub-LEDs on a submount can be as little as two or in the hundreds depending on the available operating voltage. The LED chip operating voltage can be tailored for the end application by selecting the appropriate number and size of sub-LEDs per chip. For example, a 16×225 μm×225 μm multiple sub-LED device operating at 50 volts and 22 mA (e.g. with 15 sub-LEDs), can operate with the same output characteristics as a similar sized single junction device operating at 3 V and 350 mA.

The present invention can be used to fabricate many different LED chips having essentially the same size and footprint of many commercially available single junction LED chips, such as the EZ Bright® EZ700 and EZ1000 LED chips commercially available from Cree® Inc. The EZ700 can have a chip area of approximately 680×680 μm and an active junction area of approximate 650×650 μm. The EX1000 LED chips can have an having a chip area of approximately 980× 980 μm and an active junction area of approximate 950×950 μm. Both these are commercially provided with a single junction, and according to the present invention this single junction arrangement can instead be provided as multiple sub-LEDs that can then serially interconnected.

A different number of sub-LEDs, and therefore target operating voltage and current, can be achieved simply by changing the fabrication mask layout for forming the sub-LEDs and conductive interconnects, while keeping the same fabrication process. For example, a monolithic LED chip according to the present invention can have 20 serially connected sub-LEDs. Different material systems for each of the sub-LEDs can present different sub-LED junction voltages. For Group-III nitride sub-LEDs a driving voltage of approximately 60 volts (or 3 volts per junction) can be used with an operating current of approximately 20 mA. In still other applications using U.S. grid power of approximately 150 volts (peak to valley), the monolithic LED chip can comprise 50 serially connected sub-LEDs at 3 volts per junction. For European grid power of over approximately 350 volts (peak to valley) the monolithic chip can comprise over 100 serially connected sub-LEDs. A high voltage and low current LED chip allows for the use of more efficient driver circuitry in high power lighting systems.

Different embodiments of monolithic LED chips according to the present invention can also comprise more than one group of series connected sub-LEDs on a single submount. This can require two voltages of the same or different level to be applied to the submount to drive the series connected sub-LED, depending on the number of sub-LEDs in each serially connected string. Other embodiments can comprise different combinations of series and parallel interconnected sub-LEDs. In still other embodiments, LED chips can be provided with the sub-LED already fabricated, and the operating voltage can be determined based on the number of sub-LEDs that are interconnected in series. This allows for a standard LED-chip with a standard number of sub-LEDs to be provided, with the LED chips having different interconnects to serially connect some or all of the sub-LEDs to achieve the desired operating voltage. This approach, however, can result in less than all of the sub-LEDs being utilized on the LED chip.

Features such as conversion layers and encapsulants, often referred to as packaging elements, are typically added to LED devices after the device has been mounted and wire bonded in a conventional LED package. Wire bonds are lead wires that provide electrical paths from an outside voltage/current source to the internal semiconductor layers, allowing a voltage bias to be applied to the device. Because the structures and methods disclosed in the claims obviate the need for wire bonds, packaging elements may be added to the device at the wafer level, i.e., prior to being mounted and wired bonded in a conventional LED package. The new design provides additional flexibility, permitting customers to specify additional features that may be realized at the wafer level. Also, because the features may be added to the chip at the wafer level rather than at a later packaging level, the cost to produce the chip can be significantly reduced.

Different embodiments of monolithic LED chips according to the present invention can also comprise wire-bond-free ("WBF") interconnects. This can require a number of metallization layers to be placed on the light emission area to create a series or parallel connected sub-LED, with the number of layers and interconnects dependant on several factors including the number of sub-LEDs in each connected string. Other embodiments can comprise different combinations of metallization layers, insulation layers, and vias through the insulation layers to provide electrical connections to the light emission layers and outside electricity sources. This allows for a LED-chip with a number of sub-LEDs to be provided, with the LED chips having WBF interconnects to connect some or all of the sub-LEDs to achieve the desired operating voltage. This approach can result in more reliable and less fragile high voltage LED chips. These high voltage LED chips can provide higher quantum efficiency and better use of the chip area than previous high voltage LED chips, because WBF chips do not need N-contact or wire-bond pads and fingers or a portion of the p-type layer to undergo a p-kill process.

The embodiments according to the present invention differ from the conventional LED chip architecture and technology in a number of ways. The present invention allows for breaking up a single junction LED into two or many more serially connected sub-LEDs on a monolithic surface-emitting chip. Each of the sub-LEDs can be electrically isolated from the others (apart from the interconnects), by different combination of electrical conducting and electrically insulating layers and features. In different embodiments this isolation may also require inserting an electrical insulator layer between the junctions and the metallization layers, and creating individual ohmic contacts to each junction.

Still another advantage of the multi-junction design is that the process yield (good dies per wafer) may increase due to its inherent defect tolerance. While a single shorting junction defect would fail a single junction device, the same shorting defect on one of the junctions in a multi-junction device would fail, in some cases, only an individual junction. The electrical current would pass through the defective junction and although the defective junction would not emit light, the remaining junctions would operate normally. All else being equal, the higher yield allowed by the present invention can reduce the cost of LED lighting on a lumens per dollar basis.

Further, compared to the alternative of stringing multiple small LED chips or LED packages in series to achieve high voltage/low current operation at the system level (e.g. a light bulb), the invention allows for significantly smaller source size by having the emitting junctions closer. This results in a source that more closely resembles a point source, allowing for greater efficiency and flexibility in the design of secondary optics to control the radiation pattern. Another advantage is that by using power to drive the monolithic chip that are closer to the conventional grid power, losses in converting the grid power can be reduced. Different embodiments according to the present invention can result in up to a 7 percent increase in system operating efficiency as a result of reduced conversion losses alone. The present invention also allows for reduction in the size of the conversion drive circuitry, which in turn reduces the overall size of the emitter package or solid state lighting package.

The present invention can be utilized at the LED chip level to replace single junction LED chips with series connected multiple junction LED chips. Alternatively, the present invention can be applied to larger area applications, such as the formation of series connection multiple LEDs, sub-LEDs or junctions at the wafer level or at portions of the wafer. The amount of area can depend on different factors such as the desired operating voltage and area to be covered by the different junctions. Different embodiments of the present invention can also have sub-LEDs covering different areas of the wafer or submount at the LED chip level.

The present invention is described herein with reference to certain embodiments, but it is understood that the invention can be embodied in many different forms and should not be construed as limited to the embodiments set forth herein. In particular, the present invention is described below in regards to multiple serially connected sub-LEDs in different configurations, but it is understood that the present invention can be used in many other configurations. The sub-LEDs and different components can have different shapes and sizes beyond those shown and different numbers of sub-LED can be included in the array. Some or all of the sub-LEDs can be coated with a down-converter coating that can comprise a phosphor loaded binder ("phosphor/binder coating").

It is also understood that when an element such as a layer, region or substrate is referred to as being "on" another element, it can be directly on the other element or intervening elements may also be present. Furthermore, relative terms such as "inner", "outer", "upper", "above", "lower", "beneath", "below", "first", and 'second" and similar terms, may be used herein to describe a relationship of one layer or another region. It is understood that these terms are intended to encompass different orientations of the device in addition to the orientation depicted in the figures.

It is noted that the terms "layer" and "layers" are used interchangeably throughout the application. A person of ordinary skill in the art will understand that a single "layer" of semiconductor material may actually comprise several individual layers of material. Likewise, several "layers" of material may be considered functionally as a single layer. In other words, the term "layer" does not denote an homogenous layer of semiconductor material. A single "layer" may contain various dopant concentrations and alloy compositions that are localized in sub-layers. Such sub-layers may function as buffer layers, contact layers or etch-stop layers, for example. These sub-layers may be formed in a single formation step or in multiple steps. Unless specifically stated otherwise, the Applicant does not intend to limit the scope of the invention as embodied in the claims by describing an element as comprising a "layer" or "layers" of material.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 3A:
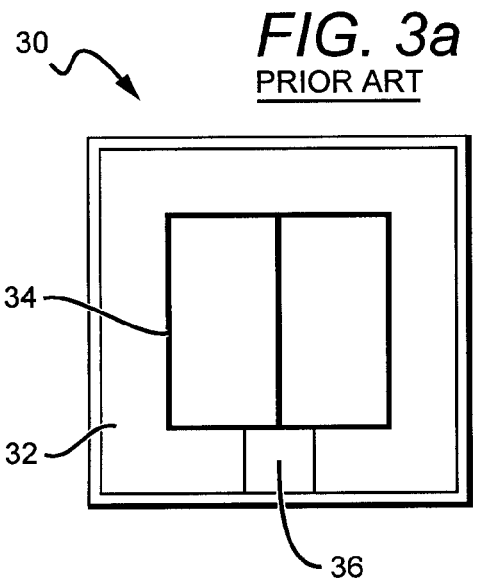
FIG. 3a shows a top view of a prior art LED chip according to the present invention.
Figure 3B:
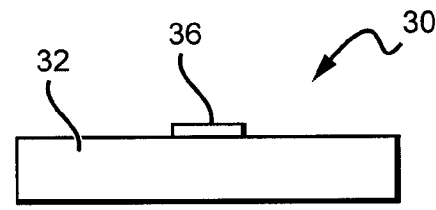
Figure 4:
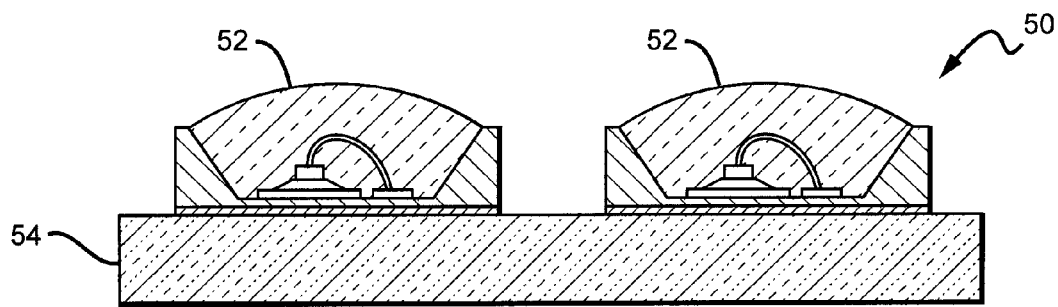
FIG. 4 is a sectional view of a prior art LED package according to the present invention.
Figure 5:
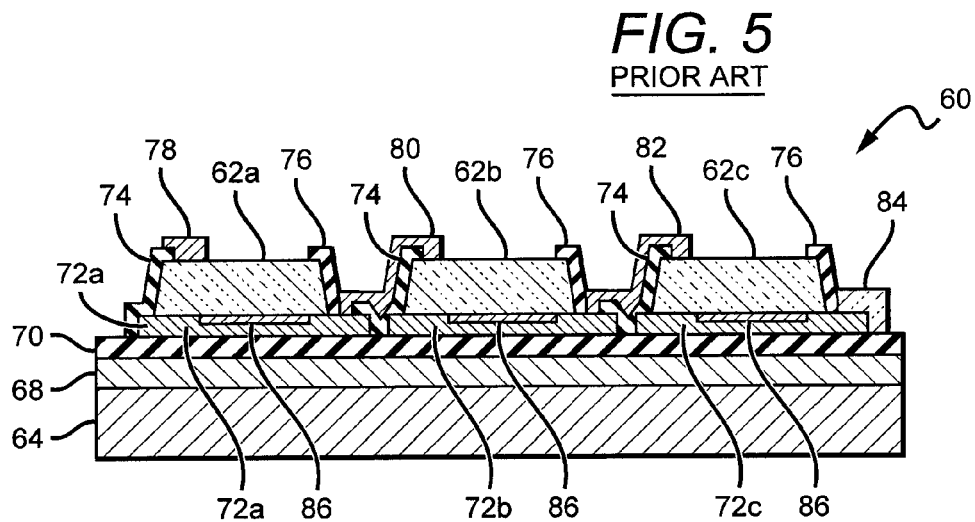
FIG. 5 is a sectional view of one embodiment of a monolithic LED chip according to the prior art.

FIGS. 6a, 6b, 7 and 8 show one embodiment of a high voltage and low current monolithic LED chip 60 according to the present invention comprising multiple WBF serially connected sub-LEDs 62a-b mounted on substrate 64. It is understood that in other embodiments, the substrate 64 can comprise a growth substrate for the LED chip 60 or a submount. This embodiment is directed to a monolithic LED chip 60 that is used instead of a single junction LED chip (e.g. as shown in FIGS. 3a and 3b) that have an active area substantially covering the substrate 64. The multiple serially connected sub-LEDs 62a-b are arranged to cover the same surface area or footprint of the single junction LED, except that a certain portion of the active area may be removed to separate the sub-LEDs 62a-b, and to allow for serial connection of the sub-LEDs 62a-b. Although only two sub-LEDs 62a-b are shown it is understood that many more sub-LEDs can be included depending on different factors such as the desired operating voltage. As mentioned above, the present invention and the embodiments described herein are equally applicable to larger area arrangements, such as at the wafer level or portions of the wafer.

Figure 7:
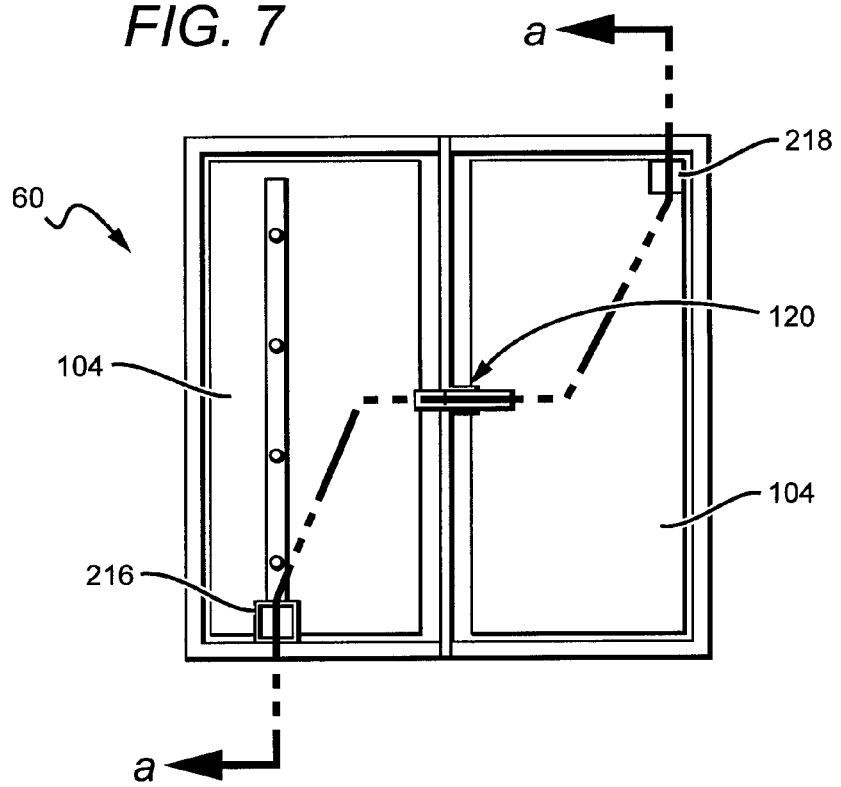
FIG. 7 is a top view of the high voltage wire bond free LED of FIG. 6b with an added metallization layer.
Figure 8:
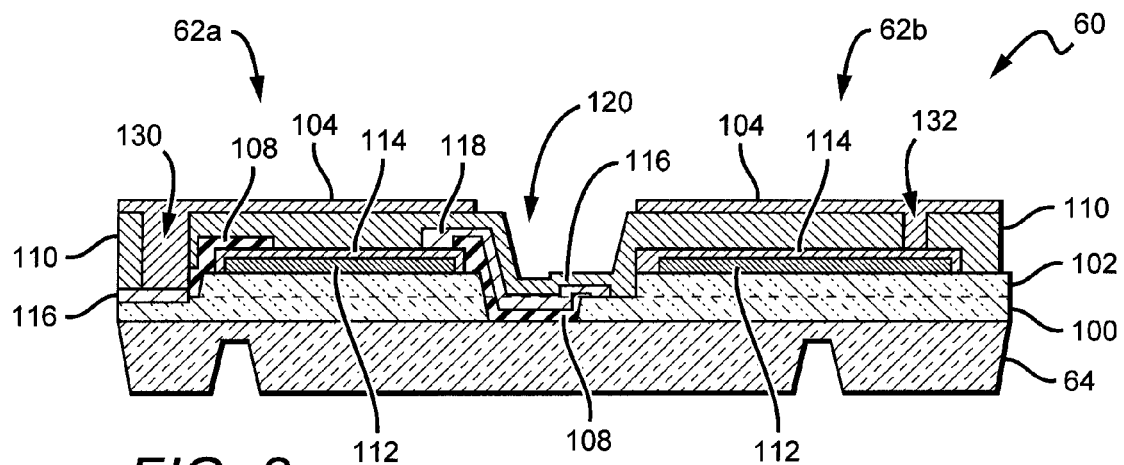
FIG. 8 is a sectional view of the high voltage wire bond free LED of FIG. 7 taken at line a-a.
Figure 9:
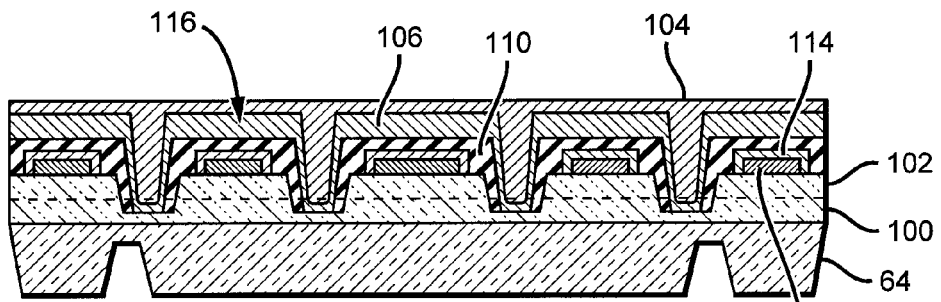
FIG. 9 is a sectional view of the high voltage wire bond free LED of FIG. 6b taken at line b-b.
Figure 10:
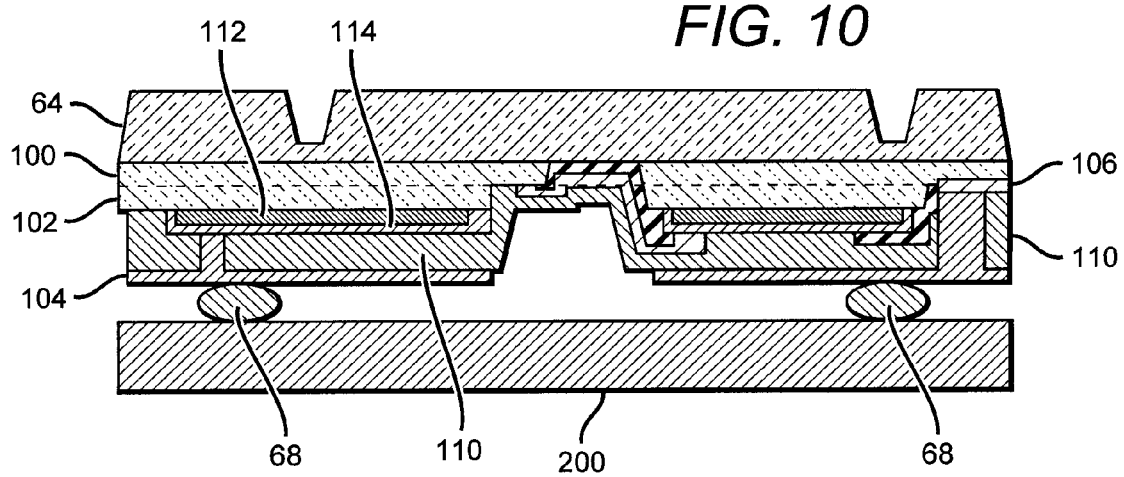
FIG. 10 is a sectional view of one embodiments of a high voltage wire bond free LED according to the present invention, flip-chip mounted on a submount.

FIG. 8 shows a sectional view, taken at line a-a in FIG. 7, of one embodiment of the sub-LEDs 62a-b in the LED chip 60. As mentioned above, many more LED chips can be provided in different series and parallel interconnections between 62a and 62b. FIG. 9 shows a section view, taken at line b-b in FIG. 6b, of one embodiment of the sub-LEDs 62a-b in the LED chip 60 according to the present invention. FIG. 10 shows the LED chip 60 of FIG. 8 flip-chip mounted on a submount. These are only a few of the many different arrangements that can be provided in the LED chips according to the present invention.

Referring again to FIGS. 6a, 6b, 7 and 8, each of the sub-LEDs 62a-b can have the similar features and characteristics as a single junction LED that covers the entire substrate 64. The sub-LEDs 62a-b can have many different semiconductor layers arranged in different ways. The fabrication and operation of the layers that comprise LEDs and sub-LEDs 62a-b, is generally known in the art and only briefly discussed herein. The layers of the sub-LEDs 62a-b can be fabricated using known processes with suitable parameters using a process such as metal organic chemical vapor deposition (MOCVD). Other methods such as vapor-phase epitaxy (VPE) or liquid-phase epitaxy (LPE) can also be used to grow semiconductor layers for LEDs. The layers of the sub-LEDs 62a-b generally comprise an active layer/region sandwiched between first and second oppositely doped epitaxial layers all of which are formed successively on a growth substrate.

It is understood that additional layers and elements can also be included in each of the sub-LEDs 62a-b, including but not limited to buffer, nucleation, contact and current spreading layers as well as light extraction layers and elements. It is also understood that the oppositely doped layers can comprise multiple layers and sub-layers, and well as supper lattice structures and inter layers. The active region can comprise single quantum well (SQW), multiple quantum well (MQW), double heterostructure or super lattice structures. The order of the layers can be different than in the embodiment shown, the first or bottom epitaxial layer can be an n-type doped layer and the second or top epitaxial layer can be a p-type doped layer, although in other embodiments the first layer can be p-type doped and the second layer n-type doped. Embodiments such as those in FIG. 8 would later be flip-chip mounted on a submount in that orientation the p-type layer is the bottom layer. In flip-chip embodiments it is understood that the top layer can be the growth substrate, and in different embodiments all or a portion of the growth substrate can be removed. The growth substrate can be removed by several known methods, including wet and dry etching processes or laser ablation. In those embodiments where the growth substrate is removed, the n-type doped layer is exposed as the top surface. In still other embodiments portions of the growth substrate can be left on the sub-LEDs 62a-b and in some embodiments can be shaped or textured to enhance light extraction.

The layers of the sub-LEDs 62a-b may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment according to the present invention, the n- and p-type layers are gallium nitride (GaN) and the active region is InGaN, but it is understood that these embodiment may include additional layers with different compositions such as AlGaN buffer layers, supper lattice structures with GaN/InGaN layers, and cap layers comprising AlGaN. In alternative embodiments the n- and p-type layers may be AlGaN, aluminum gallium arsenide (AlGaAs) or aluminum gallium indium arsenide phosphide (AlGaInAsP). Different compositions of Group-III nitride material systems can have different junction voltages, such as in the range of 2.5 to 3.5 volts.

The sub-LED growth substrate 64 can be made of many materials such as sapphire, silicon, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). It may be necessary to grow a layer of insulating material first on silicon carbide substrate to ensure the sub-LEDs are isolated except where the interconnects are. In some embodiments this substrate will be the light emission surface and thus it must be transparent. In some embodiments this substrate will be electrically insulating and function as an insulator. SiC substrates are available from Cree Research, Inc., of Durham, N.C. and methods for producing them are set forth in the scientific literature as well as in a U.S. Pat. Nos. Re. 34,861; 4,946,547; and 5,200,022.

In one embodiment, as shown in FIG. 8, n-type layer 100 and p-type layer 102 are fabricated or formed over substrate 64. These n-type 100 and p-type 102 layers may be fabricated from different material systems as described above. After n-type layer 100 and p-type layer 102 are formed or fabricated by methods described above and known in the art, the n-contacts and p-contacts are formed. These are formed by etching the n-type layers 100 and p-type layers 102 to allow placement of the n-contact pad and p-contact pad metallization layers 104, 106. Metallization layer 106, shown in FIG. 10, comprises n-contact pad 116, p-contact pad 118, and interconnect 120 as shown in FIG. 8. The n-type layers 100 and p-type layers 102 are also etched between the sub-LEDs to separate the sub-LEDs 62a-b. Electrical current is provided to the n-type 100 and p-type 102 layers by n-contact (or n-electrode) 216 and p-contact (or p-electrode) 218, through barrier 114 and mirror 112 in the second junction. These contacts 216 and 218 can be accessed from the surface of LED 60 opposite the primary emission surface. The current is passed from n-contacts 216 and p-contacts 218 through their respective vias 130, 132 in insulator 110 to the contact pad 116 or barrier 114. For placement of the n-contact pad 116, the p-type layer 102 is etched down to the n-type layer 100 and a metallization layer 106 is placed over the n-type layer 100 (shown in FIG. 9). The p-contact pad 118 of the first junction 62a is created by placing a metallization layer 106 over at least a portion of the barrier 114 and mirror 112 which cover at least a portion, preferably a majority, of all p-type 102 surfaces which have not been etched.

The p-type 102 surfaces which are not etched are covered by a mirror 112. The mirror can cover the entire p-type surface of the sub-LEDs 62a-b or can cover less than the entire p-type surface. In addition to serving as an ohmic contact to the p-type layer of the sub-LEDs 62a-b, each mirror is arranged to reflect light emitted from the active region of one or more of the sub-LEDs 62a-b toward the transparent substrate 64 so that the light contributes to useful emission from the top surface of its one of the sub-LEDs 62a-b. Mirror 112 is surrounded by a barrier layer 114. Barrier 114 is larger than the mirror 112 and completely wraps around or surrounds mirror 112. Barrier 114 prevents the mirror 112 material from diffusing out and migrating into the surrounding materials, causing shorting and other reliability issues of the LED. Mirror 112 can comprise many different materials such as highly reflective metals, like Aluminum, but preferably would be made of silver. Mirror 112 also can comprise reflective structures such as a distributed Bragg reflector (DBR). (already said 8 line earlier) Barrier 114 may be any metal which can prevent mirror 112 material migration. In one embodiment, barrier 114 is comprised of multiple metal layers, for example 3-5 layers, but can comprise more or fewer layers. In one example of a layered barrier, the outside layers of the barrier 114 can be made of a material such as titanium, for good adhesion to surrounding layers, and inner layers of the barrier 114 can be made of heavier metals, such as nickel which is a good diffusion barrier.

An insulator 108 is applied to isolate the n-contact pad 116 and associated metallization layer 106 from the p-type layer 102, barrier 114, and p-contact pad 118. This prevents the electrical signals applied to the top layers from shorting the sub-LED by traveling to unintended layers or contacts of the LEDs. Between each sub-LED is an interconnect where both the n-type 100 and p-type 102 layers are etched to the substrate 64. Insulator 108 is also applied at this interconnect to isolate the sub-LEDs and the p-contact of the previous sub-led 62a from the p-type layer 102 of the next sub-led 62b.

The electrical contact between the die attach pads formed by metallization layer 104 and the N-contact pad 116 is made through a via 130. The electrical contact between the die attach pads formed by metallization layer 104 and the barrier 114 of sub-LED 62b is made through a via 132. As shown in FIGS. 7 and 8, in order to utilize a WBF structure, the top metallization layer 104, is isolated and serves as die attach pads. Each high voltage LED 60 can have at least first and second contacts or die attach pads and in the embodiment shown the sub-LEDs 62a-b have lateral geometry. As described below, the sub-LEDs 62a-b can be contacted on their top surface as in conventional horizontal or lateral geometry devices. As further described below in other embodiments, the present invention can be used with LEDs having lateral geometry wherein the sub-LEDs can be contacted from one side or surface of the sub-LEDs, instead of both the top and bottom surfaces as is the case for vertical geometry. The first and second contacts can comprise many different materials such as Au, copper (Cu), nickel (Ni), indium (In), aluminum (Al), silver (Ag), or combinations thereof. In still other embodiments can comprise conducting oxides and transparent conducting oxides such as indium tin oxide, nickel oxide, zinc oxide, cadmium tin oxide, indium oxide, tin oxide, magnesium oxide, $ZnG_{a2}O_4$, $ZnO_2/Sb$, $G_{a2}O_3/Sn$, $AgInO_2/Sn$, $I_{n2}O_3/Zn$, $CuAlO_2$, $LaCuOS$, $CuGa_{O2}$ and $SrC_{u2}O_2$. The choice of material used can depend on the location of the contacts as well as the desired electrical characteristics such as transparency, junction resistivity and sheet resistance.

Some embodiments of sub-LEDs 62a-b can have other features and Group-III nitride based sub-LEDs for example, can have other features to assist in spreading current from the contacts. This is particularly applicable to spreading current into p-type Group-III nitrides and the current spreading structure can comprise thin semitransparent current spreading layer covering some or the entire p-type layer. These layers can comprise different materials including but not limited to a metal such as platinum (Pt) or a transparent conductive oxide such as indium tin oxide (ITO). In the embodiment shown in FIG. 8 the mirror 112 also acts as a current spreader.

As mentioned above, the sub-LEDs 62a-b in the embodiment shown can be flip-chip mounted or die attach to a submount 200, one example is shown in FIG. 10. This can occur at the wafer level or at the chip level. For mounting or die attach at the wafer level many bonding techniques can be used and in the embodiment shown a metal bond stack 68 is included between the sub-LEDs 62a-b and the submount 200, with one or more layers of the metal bond stack 68 being on the sub-LEDs 62a-b and one or more layers being on the submount 200. When the sub-LEDs 62a-b are mounted to the submount 200, the metal layers from the sub-LEDs 62a-b come in contact with the metal layers from the submount 200. Sufficient heat is applied to cause the metal layers to bond together and when the heat is removed the sub-LEDs 62a-b are held by the metal bond stack 68 to the submount 200. Metallization 104 is now in contact with the submount 200, providing electrical connection and heat dissipation to the submount. Bond stack layers can be made of different materials such as Ni, Au and Sn, or combinations and alloys thereof. It is understood that this flip-chip bonding can also occur at the LED chip level or at portions of the wafer level.

The submount 200 can be formed of many different materials such as silicon, alumina, aluminum nitride, silicon carbide, sapphire, or a polymeric material such as polymide and polyester etc. In other embodiments the submount 200 can include a highly reflective material, such as reflective ceramics, dielectrics or metal reflectors like silver, to enhance light extraction from the component. In other embodiments the submount 200 can comprise a printed circuit board (PCB), or any other suitable material, such as T-Clad thermal clad insulated substrate material, available from The Bergquist Company of Chanhassen, Minn. For PCB embodiments different PCB types can be used such as standard FR-4 metal core PCB, or any other type of printed circuit board.

As described above, in conventional low voltage and high current single junction LED chips, the LED active layers can be continuous across all or most of substrate 64 such that a single junction LED is provided. An electrical current is applied to the single LED in some embodiments with the help of current spreading structures. In the LED chip 60, the single junction LED chip is separated into multiple sub-LEDs 62a-b on substrate 64. Many different methods can be used to accomplish this separation and in one embodiment portions of the continuous LED layers can be etched away using known etching techniques to provide physical separation between the sub-LEDs 62a-b. In one embodiment portions of the LED active region and doped layers are being etched down to the substrate 64 to form the open areas between adjacent LEDs 62a-b.

It is understood that the greater the number of sub-LEDs 62a-b results in a greater number of openings or interconnects formed between sub-LEDs. With each opening or interconnect a portion of the emitting active area is removed, such that there can be less active area for the LED chip compared to single junction devices covering the same area of a chip. There is typically a corresponding reduction in active emission area with the greater the number of sub-LEDs. This reduction in active emission area can result in a corresponding increase in current density and reduction in light emission from the LED chip. The greater the reduction in the active emission area, the smaller that active area utilization ratio (i.e. ratio of active area for sub-LED device compared to the LED footprint). To minimize this reduction in emission area, the alignment tolerances between sub-LEDs should be as small as possible such that the amount of active area that is removed between sub-LEDs is as small as possible. The alignment tolerances between different layers of a multi-junction LED should be less than 5 microns, with preferred tolerances being less than 2 microns. The active area utilization ratio should be greater than 50%, with suitable embodiments have an active area utilization ratio greater than 75%.

Figure 6A:
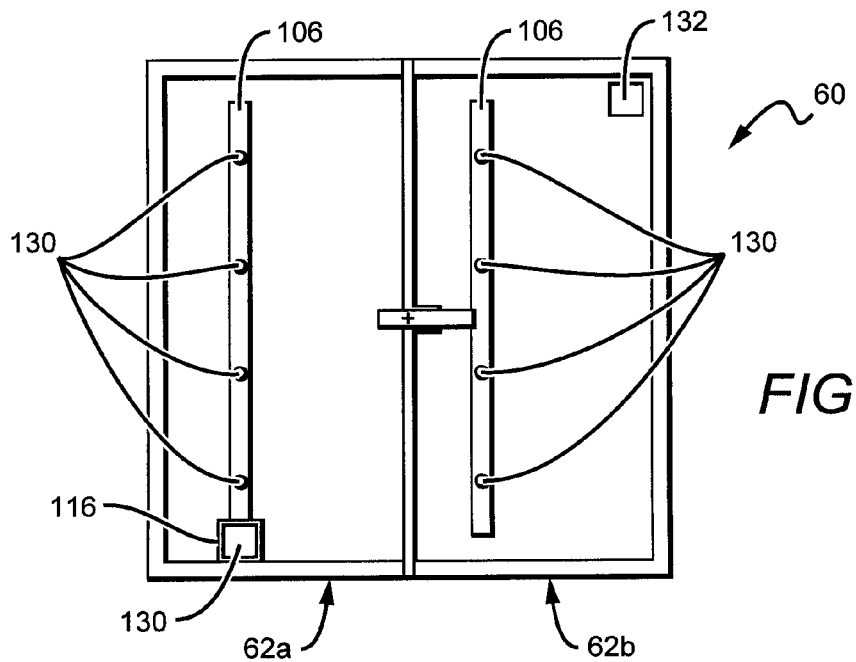
FIG. 6a is a top view of one embodiment of a high voltage wire bond free LED according to the present invention.
Figure 6B:
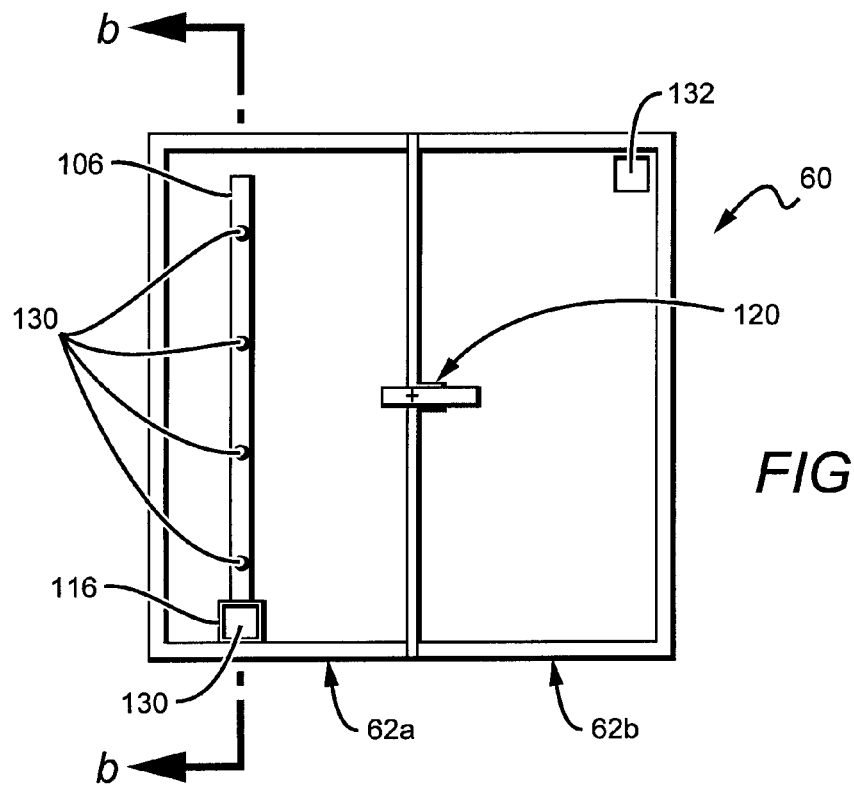
FIG. 6b is a top view of another embodiment of a high voltage wire bond free LED according to the present invention.

The number and size of the vias leading to the n-type semiconductor layer 110 also impact light emission. The greater the number of vias 130 to n-type semiconductor, and size, the greater the area of light emitting region which is removed. Therefore it is preferred to use multiple smaller vias rather than one long via spanning the entire sub-LED, as shown in FIG. 9. More vias 130 and associated metallization layers 116 help current spreading in the n-type semiconductor. FIG. 6a shows one example of how more vias 130 can be incorporated in the design.

In the embodiment shown, the sub-LEDs 62a-b are connected in series so that a current applied to the first sub-LED 62a passes through to the remaining serially connected sub-LEDs 62b. To allow for this type of serial connection, the sub-LEDs 62a-b are electrically insulated from each other except at interconnect 120. Also, in order to allow the high voltage LED to have a WBF layout, die attach pads are used on each side for n-contact and p-contact access, as shown in FIG. 7. FIGS. 6a and b show n-contact and p-contact vias 130 and 132 open through insulator 110. FIG. 7 shows the same after metallization layer 104 is added with serving as die attach pads exposed for connections. Note that metallization layer 104 is isolated, by a gap which can be located anywhere on the surface, as shown in FIG. 8, to prevent shorting of the LED 60. The electrical connection between die attach pad 104 of the first sub-LED 62a and N-electrode 116; between 104 of the second sub-LED 62b and barrier 114 is through the openings 130 and 132 respectively in the insulator 110.

Insulators 108, 110 can be deposited on the sub-LEDs 62a-62b using conventional methods and can be deposited prior to flip-chip mounting of the sub-LEDs 62a-b on the submount 200. The insulators 108, 110 can be made of many different insulating materials including but not limited to silicon nitride (SiN), aluminum nitride (AlN), silicon dioxide ($SiO_2$), or aluminum oxide ($Al_2O_3$). Polymer materials such as BCB, and polyimide can also be used.

The insulating layers 108, 110 can have many different thicknesses, with the thickness being sufficient to withstand at least the voltage applied to the serially connected sub-LEDs 62a-b. For example, for an LED chip embodiment having 50 volts applied to its sub-LEDs can have a SiN insulating layer thickness of 1,000 to 10,000 angstroms (Å). It is understood, however, that the insulating layer can have many different thicknesses as well. Thicker layers can provide the additional advantage of compensating for small manufacturing defects formed in the insulating layer during deposition. Thicker layers, however, can also reduce the ability of the LED chip to dissipate heat from the sub-LEDs. Accordingly, there is a trade-off between defect tolerance and thermal dissipation when determining the best thickness for a particular LED chip.

Conductive metallization layers 104, 106 make up a portion of the n-contact 216, n-contact pad 116, p-contact pad 118, p-contact 218 and associated vias 130, 132. Each of the metallization layers 104, 106 comprises an electrically conductive material to spread current to the contacted layers of each of the sub-LEDs 62a-b, with suitable materials being, any metal, those listed above for the first and second contacts. Metallization layer 106, in some embodiments, contacts a semiconductor material such as GaN and therefore must be comprised of a material which can provide good contact to such semiconductor materials, like Aluminum. Metallization layer 104, in some embodiments, primarily contacts other metals and should comprise of a material well suited for this type of contact, such as Titanium, TiW, gold or copper. The metallization layers 104, 106 can be fabricated using known techniques such as sputtering, evaporation or CVD techniques.

Some or all of the sub-LEDs 62a-b can be coated with one or more phosphors with the phosphors absorbing at least some of the LED light and emitting a different wavelength of light such that the LED emits a combination of light from the LED and the phosphor. Different embodiments according to the present invention comprise sub-LEDs that emit blue light that pumps (i.e. is absorbed by) the phosphor. Part of the blue light is then converted to yellow light. The sub-LEDs 62a-b emit a white light which is the result of the combination of blue and yellow light. In one embodiment the phosphor comprises commercially available YAG:Ce, although a full range of broad yellow spectral emission is possible using conversion materials based on the $(Gd,Y)_3(Al,Ga)_5O_{12}$:Ce system, such as the $Y_3Al_5O_{12}$:Ce (YAG). Other yellow phosphors that can be used for white emitting LED chips include:

$Tb_{3-x}RE_xO_{12}$:Ce (TAG); RE=Y, Gd, La, Lu; or $Sr_{2-x-y}Ba_xCa_y$-$SiO_4$:Eu.

It is understood that the different sub-LED 62a-b can be coated with different types of phosphors to absorb LED light and emit different colors of light. For example, different yellow, green, red phosphors or their mixtures can be used that exhibit excitation any wavelength in between UV and red emission spectrum. Many of these provide a desirable peak emission, have efficient light conversion, and have acceptable Stokes shift.

The sub-LEDs 62a-b can be coated with a phosphor using many different methods, with one suitable being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

It may be desirable to modify (e.g., texture or roughen) various surfaces on or within the device to provide a multitude of angled surfaces and increase light extraction. Surfaces which may be modified include the n-type layer 100, p-type layer 102 or substrate 64. A modified surface improves light extraction by providing a varying surface that allows light that would otherwise be trapped in the LED, by total internal reflection (TIR), to escape as emitted light. The variations in the modified surface increase the chances that the light will reach an emission surface within the critical angle (as defined by Snell's law) and will be emitted. For light that does not escape through the modified surface, the variations of the modified surface reflect the light at different angles, increasing the chances that the light will escape on the next pass.

There are several known methods by which a semiconductor surface may be modified. The surface may have portions removed by processes such as etching, grinding or ablation. It is also possible to add material, such as nanoparticles or light extraction elements for example, to the surface in order to give it a non-uniform texture. Adding light extraction structures to a surface within the device is discussed at length in U.S. Pat. No. 6,657,236 assigned to Cree, Inc. Another surface modification method is to damage the surface by subjecting it to high temperatures or polishing it. A combination of any of these processes may also achieve the desired surface modifications.

Some or all of the sub-LEDs 62a-b may further include a modified or roughened light emission surface. The roughened surface may be included in all or a portion of the surface area of a layer of the base LED structure or in all or a portion of the surface area of an additional layer of material applied to the base LED structure. These surfaces may be roughened as described in application Ser. No. 11/042,030, which has been incorporated entirely herein by reference. In one embodiment, substrate 64 may be the surface which is at least in part roughened. In other embodiments, for example, if substrate 64 is removed in an n-side up LED structure having a sufficiently thick n-type layer of material it may be preferable to roughen the n-type layer. In a p-side up base LED structure having a relatively thin layer of p-type material, it may be preferable to add a layer of transparent material to the p-type layer and roughen that layer. A layer of transparent material may also be added to the n-type layer of an n-side up LED structure. In either case, a roughened surface may provide better light extraction. The roughened surface improves light extraction by providing a varying surface that allows light that would otherwise be trapped in the LED by total internal reflection to escape and contribute to light emission.

It is understood that the different sub-LEDs 62a-b can be roughened with different types of roughening techniques and features. For example, the roughened surface may be achieved by etching, using any one of several methods known in the art, such as chemical etching, photoelectrochemical (PEC) etching, and reactive ion etching. Roughening can also be achieved by diamond blade or laser cutting at varies angles with respect to the surface of the LED. In addition, the LED may include side roughened-surfaces as well. Other suitable methods for surface roughening include those described in U.S. patent application Ser. No. 11/082,470.

Although the modified surface is shown as a surface of the substrate 64 opposite the n-type layer 100 in FIG. 8, it is understood that many different surfaces within the device 60 may be modified to achieve the same extraction enhancing effect. Also, device 60 might not have any modified surfaces.

In operation, electrical connections can be made to first and second die attach pads 216, 218 formed by metallization layer 104 or n-contact pad 116 and barrier 114 of the second sub-LED 62b so that an electrical current can be applied to the sub-LEDs 62a-b. The electrical current passes through the first sub-LED 62a and is conducted to the second sub-LED 62b along first interconnect 120. The current passes through the second sub-LED 62b with all the sub-LEDs emitting light in response to the electrical current applied to the die attach pads. More sub-LEDs may be added between the first and second sub-LEDs 62a-b with the interconnect 120 repeating between each of those conducting the electrical current to the next sub-LED.

A first electrical connection is made to the metallization layer 104 which serves as a die attach pad for the n-contact 216 of the first sub-LED 62a. The current then can travel to n-contact pad 116 and thereby spread through the n-type semiconductor layer 100 in the first sub-LED 62a. Insulators 108 and 110 prevent the current from traveling to the p-contact pad 118, barrier 114, mirror 112, and directly to the p-type layer 102. The current travels through the n-type layer 100 through quantum wells or active region to p-type layer 102 and the LED emits light. At least a portion of this light is then emitted from the substrate 64 either directly or after being reflected off mirror 112. The signal can then travel through mirror 112 to barrier 114 and then to p-contact pad 118. P-contact pad 118 spans the interconnect 120 between the first and second sub-LEDs 62a-b and functions as n-contact pad 116 of the second sub-LED 62b. Insulator 110 isolates the die attach pads 104 from the interconnect and barrier of both sub-LEDs 62a-b. Current then goes through interconnect 120 conductive trace created by metallization layer 106 and reaches n-type semiconductor layer 100 of the second sub-LED 62b. The current then goes through the P-N junction 100, 102 of the second sub-LED 62b and activates this sub-LED 62b. The current then travels through the mirror 112, barrier 114, and p-contact 218 to where second electrical connection is made to by metallization layer 104 which serves as a die attach pad for the p-contact 218 of the second sub-LED 62b. In the case where there are more than 2 sub-LEDs in series, more interconnects are needed to connect all the sub-LEDs. The operation of all the sub-LEDs are similar.

As mentioned above, one of the advantages of the present invention is its increased failure tolerance compared to single junction LED chips. In a monolithic LED chip having a plurality of sub-LEDs serially connected on a submount a sub-LED may have a failed junction. When this sub-LED junction fails, the sub-LED may not emit light, but it can still conduct such that the electrical current applied to the sub-LED will conduct to the remaining sub-LEDs that follow in the serial connection. The result, depending on the sub-LED failure mode, is that all the sub-LEDs can emit except the one failed sub-LED. In many applications the reduction in luminous flux from a single failed sub-LED can be acceptable. By contrast, when the junction fails in a single junction LED chip, the device does not emit light and cannot be used.

The present invention can be used in many different lighting applications, and in particular those using a small sized high output light source. Some of these include, but are not limited to, street lights, architectural lights, home and office lighting, display lighting and backlighting.

Although the present invention has been described in detail with reference to certain preferred configurations thereof, other versions are possible. Therefore, the spirit and scope of the invention should not be limited to the versions described above.

I claim:

1. A monolithic LED chip, comprising:
a plurality of sub-LEDs, said sub-LEDs interconnected without wire bonds such that the voltage necessary to drive said sub-LEDs is dependent on the number of said interconnected sub-LEDs and the junction voltage of said sub-LEDs; and
wherein said monolithic LED chip is capable of being electrically coupled for operation without wire bonds.

2. The monolithic LED chip of claim 1, wherein each of said sub-LEDs comprises a plurality of semiconductor layers and an active region interposed between said plurality of semiconductor layers.

3. The monolithic LED chip of claim 2 further wherein said plurality of semiconductor layers comprises at least an n-type semiconductor layer and a p-type semiconductor layer.

4. The monolithic LED chip of claim 2 further comprising a p-electrode accessible from a point on a surface opposite of a primary emission surface of said monolithic LED chip and an n-electrode having a lead that is accessible from a point on said surface opposite of said primary emission surface.

5. The monolithic LED chip of claim 4, wherein said p-electrode and said n-electrode are electrically coupled to said semiconductor layers such that a single applied to said p- and n-electrodes causes said sub-LEDs to emit light.

6. The monolithic LED chip of claim 3, further comprising electrically conductive and electrically insulating features to interconnect said sub-LEDs.

7. The monolithic LED chip of claim 6, wherein said electrically conductive features further comprise at least one metallization layer on at least a portion of said plurality of semiconductor layers to interconnected sub-LEDs and said electrically insulating features further comprise at least one insulator layer between at least a portion of said metallization layer and say n-type and p-type semiconductor layers.

8. The monolithic LED chip of claim 7, further comprising vias provided through at least a portion of said at least one insulator layer electrically connecting said p-electrode and said n-electrode to said metallization layer.

9. The monolithic LED chip of claim 6, wherein said electrically conductive features are internal to said LED chip.

10. The monolithic LED chip of claim 6, wherein said electrically insulating features insulate said electrically conductive features from other portions of said LED chip to prevent shorting of said electrically conductive features.

11. The monolithic LED chip of claim 3, further comprising an n-contact pad contacting said n-type semiconductor layer and providing an electrical connection between said n-type semiconductor layer and said n-electrode.

12. The monolithic LED chip of claim 3, further comprising a p-contact pad contacting said p-type semiconductor layer and providing an electrical connection between said p-type semiconductor layer and said p-electrode.

13. The monolithic LED chip of claim 12, wherein said p-contact pad functions as a current spreading layer.

14. The monolithic LED chip of claim 12, wherein said p-contact pad comprises a reflective material.

15. The monolithic LED chip of claim 12, further comprising a reflective material on the side of said p-contact pad facing the primary emission surface.

16. The monolithic LED chip of claim 15, further comprising a barrier material surrounding the reflective material on all sides except the side facing said primary emission surface.

17. The monolithic LED chip of claim 15 wherein said reflective material is electrically conductive.

18. The monolithic LED chip of claim 16, wherein the reflective material and barrier material are electrically conductive.

19. The monolithic LED chip of claim 1, wherein each of said sub-LEDs are formed from a single junction LED.

20. The monolithic LED chip of claim 19, wherein each of said sub-LEDs are formed from a single junction LED by removing portions of said single junction LED.

21. The monolithic LED chip of claim 19, wherein the active area utilization ratio is greater than 50%.

22. The monolithic LED chip of claim 19, wherein the active area utilization ratio is greater than 75%.

23. The monolithic LED chip of claim 3, further comprising a phosphor layer disposed opposite said leads of said n- and p-electrodes such that said phosphor layer comprises said primary emitting surface.

24. The monolithic LED chip of claim 3, wherein the primary emission surface is a substrate.

25. The monolithic LED chip of claim 24, wherein said substrate is comprised of an insulating material.

26. The monolithic LED chip of claim 3, wherein the primary emission surface is said n-type layer.

27. The monolithic LED chip of claim 3, wherein the primary emission surface is said p-type layer.

28. The monolithic LED chip of claim 1, emitting a white light from said sub-LEDs.

29. The monolithic LED chip of claim 1, emitting down converted light from said sub-LEDs.

30. The monolithic LED chip of claim 1, wherein the remaining ones of said serially connected sub-LEDs are capable of emitting light in response to said drive voltage when one of said sub-LEDs fails.

31. The monolithic LED chip of claim 7, wherein said insulator layers comprise dielectric materials.

32. The monolithic LED chip of claim 7, wherein said insulator layers comprise a polymer.

33. The monolithic LED chip of claim 7, wherein said insulator layers comprise an inorganic material.

34. The monolithic LED chip of claim 33, wherein said inorganic material comprises silicon nitride or silicon oxide.

35. The monolithic LED chip of claim 2, wherein said plurality of semiconductor layers and said active region comprise materials from the Group-III Nitrides.

36. A LED chip, comprising:
a plurality of sub-LEDs on a submount, wherein said sub-LEDs are formed from a single junction LED such that said sub-LEDs are electrically integrally connected; and
electrically conductive and electrically insulating features interconnecting said sub-LEDs such that an electrical current applied to said sub-LEDs spreads to all said sub-LEDs, wherein said LED chip is capable of being electrically coupled for operation without wire bonds.

37. The LED chip of claim 36, wherein the voltage necessary to drive said sub-LEDs is dependent on the number of said interconnected sub-LEDs and the junction voltage of said sub-LEDs.

38. The LED chip of claim 36, wherein said sub-LEDs are formed from a single junction LED by removing portions of said single junction LED.

39. The LED chip of claim 38, wherein the active area utilization ratio is greater than 50%.

40. The LED chip of claim 38, wherein the active area utilization ratio of said single junction LED active region is greater than 75%.

41. The LED chip of claim 36, wherein said electrically conductive features are comprised of at least one metallization layer placed on at least a portion of a light emission area of said sub-LED's, opposite a primary light emission surface, said at least one metallization layer insulated such that it does not short circuit said sub-LEDs.

42. The LED chip of claim 36, wherein said sub-LEDs are flip-chip mounted on said submount.

43. A LED chip, comprising:
a plurality of sub-LEDs on a submount, wherein said sub-LEDs are electrically integrally connected;
a plurality of bottom contacts, each of which is located on a surface opposite of a primary light emission surface of said sub-LEDs;
metallization layers placed on at least a portion of a light emission area of said sub-LEDs, opposite said primary light emission surface, interconnecting said sub-LEDs; and
insulating features to insulate portions of said sub-LEDs from said metallization layers.

44. The LED chip of claim 43, wherein said the drive voltage is dependent on the number of said interconnected sub-LEDs and the junction voltage of said sub-LEDs.

45. The LED chip of claim 43, wherein said primary light emission surface comprises a modified surface to increase light extraction from said LED chip.

46. The LED chip of claim 45, wherein said modified surface has been textured.

47. The LED chip of claim 43, further comprising conductive implants for making electrical connection to said sub-LEDs.

48. The LED chip of claim 43, further comprising a phosphor layer disposed over at least a portion of said primary light emission surface, said phosphor layer constituting at least a portion of said top surface of said LED chip and said sub-LEDs.

49. The LED chip of claim 48, wherein said sub-LEDs further comprise sidewalls;
said phosphor layer further disposed over at least a portion of said sidewalls; and
said phosphor layer further constituting at least a portion of said sidewalls of said LED chip and said sub-LEDS.

* * * * *